United States Patent [19]

Siwko

[11] Patent Number: 5,883,663
[45] Date of Patent: Mar. 16, 1999

[54] MULTIPLE IMAGE CAMERA FOR MEASURING THE ALIGNMENT OF OBJECTS IN DIFFERENT PLANES

[76] Inventor: Robert P. Siwko, 610 Brigham St., Marlborough, Mass. 01752

[21] Appl. No.: 752,976

[22] Filed: Dec. 2, 1996

[51] Int. Cl.[6] ............................. H04N 07/18; G06K 9/36; G06K 9/44
[52] U.S. Cl. ................................. 348/87; 348/86; 348/88; 348/125; 348/126; 382/144; 382/145; 382/146; 356/237
[58] Field of Search ................................. 348/86, 87, 88, 348/91, 92, 93, 94, 95, 125, 126, 128, 129, 133; 382/144, 145, 146, 147, 148, 149, 150, 151, 202, 204, 199; 364/478, 479; 356/237

[56] References Cited

U.S. PATENT DOCUMENTS

| | | | |
|---|---|---|---|
| Re. 34,615 | 5/1994 | Freeman | 348/95 |
| 3,988,535 | 10/1976 | Hickman et al. | 178/6.8 |
| 4,613,942 | 9/1986 | Chen | 364/513 |
| 4,642,813 | 2/1987 | Wilder | 382/8 |
| 4,643,579 | 2/1987 | Toriumi et al. | 356/401 |
| 4,855,830 | 8/1989 | Davis et al. | 358/168 |
| 4,899,920 | 2/1990 | Abbagnaro et al. | 228/11 |
| 4,899,921 | 2/1990 | Bendat et al. | 228/105 |
| 4,924,304 | 5/1990 | Freeman | 358/101 |
| 4,969,746 | 11/1990 | McConnell et al. | 356/237 |
| 5,113,565 | 5/1992 | Cipolla et al. | 29/25.01 |
| 5,140,643 | 8/1992 | Izumi et al. | 348/87 |
| 5,194,948 | 3/1993 | L'Esperance, III et al. | 358/106 |
| 5,225,891 | 7/1993 | Choumei | 356/237 |
| 5,249,239 | 9/1993 | Kida | 382/144 |
| 5,305,099 | 4/1994 | Morcos | 348/88 |
| 5,311,304 | 5/1994 | Monno | 348/87 |
| 5,550,583 | 8/1996 | Amir et al. | 348/126 |

OTHER PUBLICATIONS

Summit 1000 Brochure, Sierra Research and Technology, Inc., Westford, Massachusetts.
Summit 2000 Brochure, Sierra Research and Technology, Inc., Westford, Massachusetts.

*Primary Examiner*—Tommy P. Chin
*Attorney, Agent, or Firm*—Brian M. Dingman

[57] ABSTRACT

A multiple image camera for measuring the alignment of objects in different planes. The camera includes two coupled imaging devices configured to directly image objects in different planes without any intervening reflective optics between the imaging devices and the objects. The camera thus allows measurement of the alignment between the first and second objects without the need for repeated calibration between the image from the two imaging devices.

11 Claims, 2 Drawing Sheets

MULTIPLE IMAGE CAMERA FOR MEASURING THE ALIGNMENT OF OBJECTS IN DIFFERENT PLANES

FIELD OF THE INVENTION

This invention relates to a multiple image camera which is adapted to simultaneously image objects in different planes. The camera thus provides images which can be used to align objects that need to be aligned, such as an electronic component and the circuit board on which the component is to be placed.

BACKGROUND OF THE INVENTION

There are myriad instances in which it is necessary to precisely align two objects. For example, an electronic component to be placed on a carrier such as a printed circuit board must be aligned to within very tight tolerances with the conductors on the circuit board, before it is placed. In the same industry, it is also necessary to align a stencil with a printed circuit board when applying solder paste to the board. These are but two examples of this alignment need.

The object alignment in such instances can be accomplished using direct vision, either unassisted or with assisting optics ranging from a simple magnifying glass to sophisticated microscopes. Direct camera vision may be used to assist the operation. More sophisticated methods employ superimposition or juxtaposition of images of the objects on a video monitor. Typically, the two images are created using a single video camera or CCD, (or perhaps two image sensors), and reflecting optics such as prisms to direct light rays from both objects to the imaging device. Examples of such imaging systems may be found in U.S. Pat. No. 5,311,304, to Monno; U.S. Pat. No. 3,988,535, to Hickman et al.; U.S. Pat. No. 4,642,813, to Wilder; U.S. Pat. No. 4,643,579, to Toriumi; and U.S. Pat. No. 4,899,921, to Bendat et al., and the Summit Series rework systems made by Sierra Research and Technology, Inc., Westford, Mass. 01886.

Direct vision alignment leads to parallax errors, and often has insufficient resolution for fine alignment needs. In addition, direct operator vision alignment is subject to operator error. Imaging systems employing reflecting optics between the image capture device and the objects being imaged are also problematic. Reflecting prisms and mirrors can cause image distortion, leading to alignment errors. Reflecting optics are also subject to thermal instability, which can also lead to alignment errors. Also, since a single image capture device is being used to capture images of two objects, each image is by definition not as bright as the entire image, making such systems more difficult to use, and more likely to result in alignment errors.

There are also imaging systems having a single camera which is moved to sequentially image the two objects. Examples include U.S. Pat. No. 4,924,304, and Re. Pat. No. 34,615, both to Freeman. Such systems require precision mechanical systems to accomplish the necessary movement of the camera or the imaging optics. Such mechanical systems are expensive, require careful calibration, and are prone to error, particularly as they wear.

Similar systems exist which use two separate imaging devices, usually oriented in parallel, or normal to one another. Examples include U.S. Pat. No. 5,194,948, to L'Esperance; U.S. Pat. No. 5,305,099, to Morcos; U.S. Pat. No. 5,113,565, to Cipolla et al.; and U.S. Pat. No. 4,855,830, to Davis et al. The use of separate sensors, however, requires careful calibration before use, and is prone to misalignment errors because the alignment is dependent on the accuracy of two separate camera positioning and moving devices; if either one wears or introduces error, the entire system will be in error.

SUMMARY OF THE INVENTION

It is therefore an object of this invention to provide a multiple image camera for measuring the alignment of objects in different planes.

It is a further object of this invention to provide such a multiple image camera that does not cause parallax errors.

It is a further object of this invention to provide such a multiple image camera that is less prone to camera alignment errors.

It is a further object of this invention to provide such a multiple image camera which does not require precision optics movement systems.

It is a further object of this invention to provide such a multiple image camera which is less likely to result in incorrect alignment between the objects being imaged.

It is a further object of this invention to provide such a multiple image camera which can provide increased image resolution.

It is a further object of this invention to provide such a multiple image camera which is not subject to thermal misalignment.

This invention results from the realization that the alignment of objects in different planes can be simply, inexpensively, and accurately accomplished with a multiple image camera having two imaging devices that are mechanically coupled so that the two objects can be simultaneously imaged without the need for intervening reflecting optics that can cause alignment errors.

This invention features a multiple image camera for measuring the alignment of objects in different planes, comprising: a first imaging device with a first focusing lens, the first imaging device configured to directly image a first object through the first lens along a first imaging axis, without any intervening reflective optics between the first imaging device and the first object; and a second imaging device with a second focusing lens, the second imaging device configured to directly image a second object through the second lens along a second imaging axis, without any intervening reflective optics between the second imaging device and the second object; whereby the first and second imaging devices are fixed relative to one another, to allow measurement of the alignment between the first and second objects without the need for repeated calibration between the images from the two imaging devices. More than two, spatially fixed, imaging devices are also contemplated.

The first and second imaging devices are preferably charge coupled devices (CCD). The charge coupled devices may be mounted to opposite sides of a flat electronic component carrier such as a printed circuit board. Also included may be some means for providing light along the two imaging axes, which may be accomplished with one or more light emitting diodes mounted on each side of the electronic component carrier.

In one embodiment, the first and second imaging axes are generally parallel, and may be nominally coaxial, so that the camera can be placed between two spaced objects to image the top of one object, and the bottom of the other object. This arrangement allows the camera to be used to image the underside of an object such as an electronic component which is to be precisely placed on a component carrier located directly below the component, which is also imaged. When alignment is accomplished in this manner, the camera can be moved, and the component can then be placed on the board by moving it straight down, with component movement taking place along only a single axis. This simplifies the component-moving device, leading to better component placement accuracy.

There may be included in the camera of this invention lens fixing means, for maintaining a defined relationship between each imaging device and its associated lens. The lens fixing means may be accomplished with a lens housing for each lens, and adjustment means to allow the distance between each imaging device and its associated lens to be adjusted. The lens housing may include an aperture. There may also be included a light-blocking seal at the junction of each lens housing and the imaging device carrying structure, to prevent ambient light from entering the lens housing except through the lens.

BRIEF DESCRIPTION OF THE DRAWINGS

Other objects, features and advantages will occur to those skilled in the art from the following description of the preferred embodiment, and the accompanying drawings, in which.

DESCRIPTION OF THE PREFERRED EMBODIMENT

This invention may be accomplished in a multiple image camera for measuring the alignment of objects in different planes. The camera includes two imaging devices which are mechanically coupled so that their imaging axes are fixed relative to one another. Consequently, the camera can be used to simultaneously image two objects which need to be aligned, without the potential misalignment problems caused by similar systems with a single camera that is either moved to sequentially image the two objects, or includes reflecting optics to simultaneously direct images of both objects to the camera. Also, there is no potential for error, introduced through the use of two separate camera mounting (and perhaps moving) devices.

Figure 1:
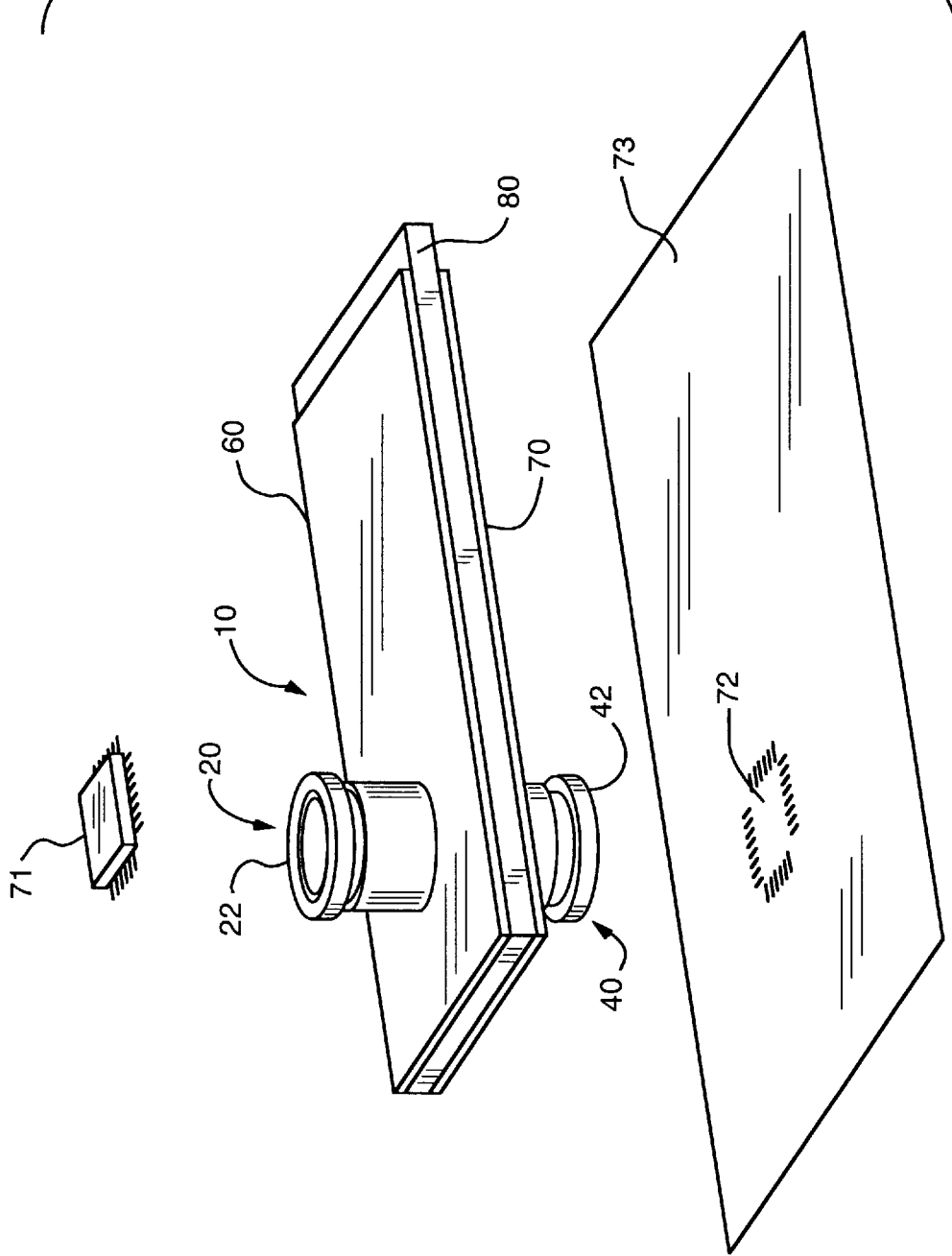
FIG. 1 is a schematic, three-dimensional view of a multiple image camera according to this invention in use in an electronic component mounting operation.

There is shown in FIG. 1 multiple image camera 10 according to this invention. Camera 10 includes first camera system 20, with housing 22 mounted to printed circuit board 60. Identical camera system 40, with housing 42, is mounted to printed circuit board 70. Boards 60 and 70 are mounted to planar support structure 80. Camera 10 is placed between electronic component 71 and conductor pattern 72 on printed circuit board 73, to which component 71 is to be mounted. To properly place component 71 on pattern 72, it is necessary to carefully align the two, and then place component 71 on board 73. Multiple image camera 10 facilitates this operation by simultaneously imaging the underside of component 71, and the top side of pattern 72. These two images are intended to be provided to an existing image display, and related component/board movement and control system, which would be used to accomplish the necessary alignment between component 71 and pattern 72, and subsequent placement of component 71 on pattern 72. The image capture and display, and component/board movement and control systems, do not form part of this invention, and so are not shown in the drawings. An example of a commercially available system which can accomplish these functions is the Summit Series products mentioned earlier.

Figure 2:
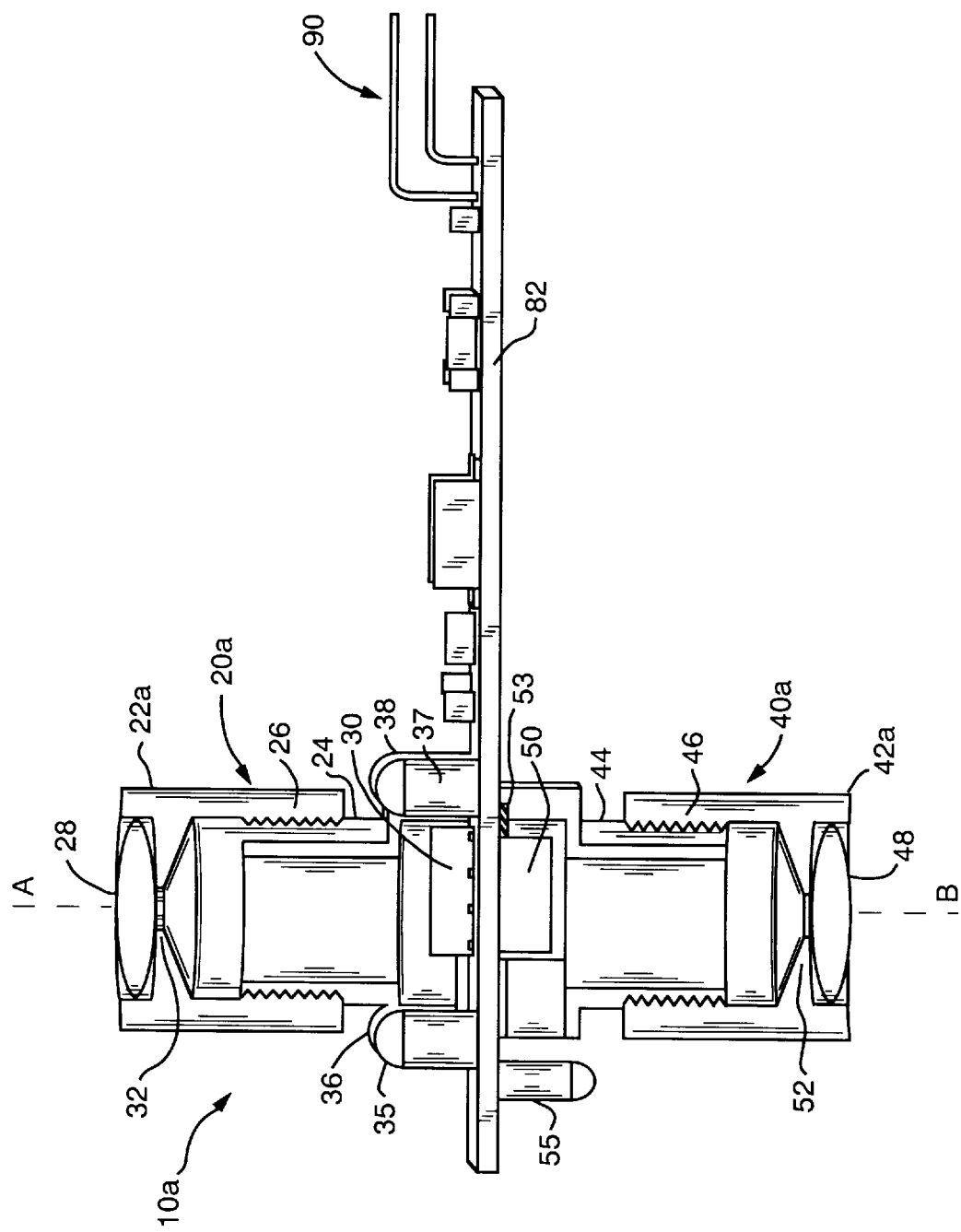
FIG. 2 is a cross-sectional view of a preferred embodiment of the multiple image camera according to this invention, mounted to a printed circuit board.

A preferred embodiment of this invention is depicted in FIG. 2. Multiple image camera 10a includes camera system 20a, which itself includes first imaging device 30, which is preferably a Texas Instruments model TC 255 CCD image sensor mounted to the top side of printed circuit board 82. Imaging device 30 is configured to capture images along imaging axis A, through focusing lens 28. Lens 28 is carried by a lens fixing means accomplished by lens housing 22a. Housing 22a includes upper portion 26 which defines aperture 32 above which lens 28 is held. Housing portion 26 is internally threaded along the area which engages with lower housing portion 24, to allow the distance between CCD 30 and lens 28 to be changed, to allow the focus to be changed. Also, this allows another lens to replace lens 28. Lower housing portion 24 is coupled to board 82, surrounding CCD 30. Light is provided along axis A by LEDs (light emitting diodes) 35 through 38, which are also mounted to the top side of board 82. This ensures good image quality.

Second camera system 40a, which is identical to first camera system 20a, is mounted to the underside of board 82, to capture images along second imaging axis B. Axis B is preferably nominally coaxial with axis A. Camera system 40a includes second imaging device 50, which is also a CCD. Lens housing 42a includes upper portion 46 which defines aperture 52 above which lens 48 is held. Housing portion 46 is internally threaded along the area which engages with lower housing portion 44, to allow the distance between CCD 50 and lens 48 to be altered. Lower housing portion 44 is coupled to board 82, surrounding CCD 50. Light is provided along axis B by LEDs such as LED 55. Ambient light is prevented from leaking into housing 42a where it meets board 82 by O-ring 53. An identical O-ring (not shown) is within housing 22a.

Board 82 carries additional electronic components that provide signal processing which does not form part of this invention. Connector 90 is included to provide power to the components on board 82, including the two CCDs 30 and 50, and the LEDs 35–38 and 55, and to transmit image signals to a frame grabber board in a PC (neither being shown in the drawing). CCDs 30 and 50 could be replaced with a single component with CCD imaging devices on opposite sides, or with other electronic image-capturing technologies.

The multiple image camera of this invention is not limited to the embodiments shown in the figures, in which the imaging axes are nominally coaxial. Nor is the camera limited to only two imaging devices, as more than two could be useful. Other spatial arrangements are also contemplated, in which the two or more imaging devices are fixed relative to one another so that the imaging axes are fixed, and their relationship is known. For example, the imaging axes could be normal, or at any other angle(s) as necessary to accomplish the imaging needed for the alignment or other imaging task being accomplished. The coaxial imaging disclosed in detail may be preferred when one object is being placed on another, because the multiple image camera can be placed between the two objects until they are exactly aligned, and then the camera can be moved, and the objects brought together by movement along only a single axis (typically a vertical axis). Movement along one axis is less complex, and less likely to result in misalignment, as compared to movement along more than one axis as is required in some similar systems.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A multiple image camera for measuring an alignment of objects in different planes, comprising:
   a first CCD imaging device with a first focusing lens, the first imaging device configured to directly image a first object through the first lens along a first imaging axis, without any intervening reflective optics between the first imaging device and the first object; and
   a second CCD imaging device with a second focusing lens, the second imaging device configured to directly image a second object through the second lens along a second imaging axis, without any intervening reflective optics between the second imaging device and the second object;
   whereby the first and second imaging devices are fixed relative to one another, and are directly or indirectly mounted on opposite sides of a flat electronic component carrier, to allow measurement of the alignment between the first and second objects without a need for repeated calibration between the images from the two imaging devices.

2. The multiple image camera of claim 1 in which the first and second imaging axes are generally parallel.

3. The multiple image camera of claim 2 in which the first and second imaging axes are nominally coaxial.

4. The multiple image camera of claim 1 further including lens fixing means for maintaining a defined relationship between each imaging device and its associated lens.

5. The multiple image camera of claim 4 in which the lens fixing means includes a lens housing for each lens, and adjustment means to allow a distance between each imaging device and its associated lens to be adjusted.

6. The multiple image camera of claim 5 in which the lens housings each include an aperture.

7. The multiple image camera of claim 1 further including means for providing light along the first and second imaging axes.

8. The multiple image camera of claim 7 in which the means for providing light includes at least one LED mounted on each side of the electronic component carrier.

9. The multiple image camera of claim 1 in which the first and second objects lie generally in parallel, opposed planes.

10. A multiple image camera for measuring the alignment of objects in different planes, comprising:
    a printed circuit board defining parallel faces;
    a first CCD mounted to a first face of the printed circuit board;
    a first lens directly over the first CCD, above the first face of the circuit board, for focusing light onto the first CCD;
    a first lens housing coupled to the first face of the circuit board, and holding the first lens relative to the first CCD;
    a second CCD mounted to a second face of the printed circuit board;
    a second lens directly over the second CCD, above the second face of the circuit board, for focusing light onto the second CCD; and
    a second lens housing coupled to the second face of the circuit board, and holding the second lens relative to the second CCD.

11. A multiple image camera for measuring the alignment of objects in different planes, comprising:
    a printed circuit board defining parallel faces;
    a first CCD mounted to a first face of the printed circuit board;
    a first lens directly over the first CCD, above the first face of the circuit board, for focusing light onto the first CCD;
    a first lens housing coupled to the first face of the circuit board and surrounding the first CCD, and holding the first lens relative to the first CCD;
    a light-blocking seal at a junction of the first lens housing and the first face of the circuit board, to prevent ambient light from entering the first lens housing, except through the first lens;
    a second CCD mounted to a second face of the printed circuit board;
    a second lens directly over the second CCD, above the second face of the circuit board, for focusing light onto the second CCD;
    a second lens housing coupled to the second face of the circuit board and surrounding the second CCD, and holding the second lens relative to the second CCD;
    a light-blocking seal at a junction of the second lens housing and the second face of the circuit board, to prevent ambient light from entering the second lens housing, except through the second lens.

* * * * *